United States Patent
Campbell et al.

(10) Patent No.: US 7,885,074 B2
(45) Date of Patent: Feb. 8, 2011

(54) DIRECT JET IMPINGEMENT-ASSISTED THERMOSYPHON COOLING APPARATUS AND METHOD

(75) Inventors: Levi A. Campbell, Poughkeepsie, NY (US); Richard C. Chu, Poughkeepsie, NY (US); Michael J. Ellsworth, Jr., Poughkeepsie, NY (US); Madhusudan K. Iyengar, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/491,289

(22) Filed: Jun. 25, 2009

(65) Prior Publication Data

US 2010/0328882 A1    Dec. 30, 2010

(51) Int. Cl.
*H05K 7/20* (2006.01)
*G06F 1/20* (2006.01)

(52) U.S. Cl. ............. 361/700; 361/679.47; 361/679.52; 361/679.53; 361/699; 165/104.33; 165/908; 62/259.2; 700/300

(58) Field of Classification Search ................
361/679.52–679.54, 699–704, 718; 165/80.4–80.5, 165/104.33, 185, 908; 174/15.2; 62/259.2; 700/300
See application file for complete search history.

(56) References Cited

U.S. PATENT DOCUMENTS

| | | | |
|---|---|---|---|
| 2,643,282 | A | 6/1953 | Greene |
| 2,942,165 | A | 6/1960 | Jackson et al. |
| 3,109,485 | A | 11/1963 | Fortier |
| 3,222,580 | A | 12/1965 | Curll |
| 4,064,300 | A | 12/1977 | Bhangu |

(Continued)

FOREIGN PATENT DOCUMENTS

JP        8-254512 A    10/1996

(Continued)

OTHER PUBLICATIONS

Iyengar et al., "Apparatus and Method for Facilitating Cooling of an Electronics System", U.S. Appl. No. 11/957,619, filed Dec. 17, 2007.

(Continued)

*Primary Examiner*—Robert J Hoffberg
(74) *Attorney, Agent, or Firm*—Geraldine Monteleone, Esq.; Kevin P. Radigan, Esq.; Heslin Rothenberg Farley & Mesiti P.C.

(57) ABSTRACT

Cooling apparatuses and methods are provided for facilitating cooling of an electronic device utilizing a cooling subassembly, a pump and a controller. The cooling subassembly includes a jet impingement structure, and a thermosyphon. The jet impingement structure directs coolant into a chamber of the subassembly onto a surface to be cooled when in a jet impingement mode, and the thermosyphon, which is associated with the chamber, facilitates convective cooling of the surface to be cooled via boiling of coolant within the chamber when in a thermosyphon mode. The controller, which is coupled to the pump to control activation and deactivation of the pump, also controls transitioning between the jet impingement mode and the thermosyphon mode based on a sensed temperature of the electronic device.

19 Claims, 10 Drawing Sheets

U.S. PATENT DOCUMENTS

| | | | |
|---|---|---|---|
| 4,108,242 | A | 8/1978 | Searight et al. |
| 4,201,195 | A | 5/1980 | Sakhuja |
| 4,622,946 | A | 11/1986 | Hurley et al. |
| 4,750,086 | A | 6/1988 | Mittal |
| 4,833,567 | A | 5/1989 | Saaski et al. |
| 5,063,476 | A | 11/1991 | Hamadah et al. |
| 5,126,919 | A | 6/1992 | Yamamoto et al. |
| 5,183,104 | A | 2/1993 | Novotny |
| 5,220,804 | A | 6/1993 | Tilton et al. |
| 5,349,831 | A | 9/1994 | Daikiku et al. |
| 5,351,748 | A | 10/1994 | Dagan |
| 5,718,117 | A | 2/1998 | McDunn et al. |
| 5,726,495 | A | 3/1998 | Aihara et al. |
| 5,781,411 | A | 7/1998 | Feenstra |
| 5,854,092 | A | 12/1998 | Root et al. |
| 5,963,425 | A | 10/1999 | Chrysler et al. |
| 6,000,908 | A | 12/1999 | Bunker |
| 6,134,108 | A | 10/2000 | Patel et al. |
| 6,134,783 | A | 10/2000 | Bargman et al. |
| 6,193,905 | B1 | 2/2001 | Yamada et al. |
| 6,366,462 | B1 | 4/2002 | Chu et al. |
| 6,378,605 | B1 | 4/2002 | Kutscher et al. |
| 6,431,260 | B1 | 8/2002 | Agonafer et al. |
| 6,519,151 | B2 | 2/2003 | Chu et al. |
| 6,549,408 | B2 * | 4/2003 | Berchowitz ............ 361/700 |
| 6,550,263 | B2 | 4/2003 | Patel et al. |
| 6,571,569 | B1 | 6/2003 | Rini et al. |
| 6,817,196 | B2 | 11/2004 | Malone et al. |
| 6,817,405 | B2 | 11/2004 | Kamath et al. |
| 6,918,435 | B2 | 7/2005 | Dwyer |
| 6,926,071 | B2 | 8/2005 | Lee et al. |
| 6,938,678 | B1 | 9/2005 | Bortolini et al. |
| 7,079,393 | B2 | 7/2006 | Colgan et al. |
| 7,134,289 | B2 | 11/2006 | Patel et al. |
| 7,284,389 | B2 | 10/2007 | Sharma et al. |
| 7,307,841 | B2 | 12/2007 | Berlin et al. |
| 7,349,213 | B2 | 3/2008 | Campbell et al. |
| 7,357,173 | B2 | 4/2008 | Griesmayer |
| 7,362,574 | B2 | 4/2008 | Campbell et al. |
| 7,369,410 | B2 | 5/2008 | Chen et al. |
| 7,375,962 | B2 | 5/2008 | Campbell et al. |
| 7,380,409 | B2 | 6/2008 | Campbell et al. |
| 7,450,385 | B1 | 11/2008 | Campbell et al. |
| 7,477,513 | B1 | 1/2009 | Cader et al. |
| 7,495,914 | B2 | 2/2009 | Tilton et al. |
| 2001/0006101 | A1 * | 7/2001 | Chu et al. ............ 165/80.3 |
| 2002/0062945 | A1 | 5/2002 | Hocker et al. |
| 2004/0246683 | A1 | 12/2004 | Honsberg-Riedl et al. |
| 2006/0039111 | A1 | 2/2006 | Huang |
| 2006/0162365 | A1 | 7/2006 | Hoang et al. |
| 2006/0191675 | A1 | 8/2006 | Fletcher et al. |
| 2007/0133173 | A1 | 6/2007 | Hsiung et al. |
| 2007/0201210 | A1 | 8/2007 | Chow et al. |
| 2008/0002363 | A1 | 1/2008 | Campbell et al. |
| 2008/0225478 | A1 | 9/2008 | Goettert et al. |
| 2009/0284918 | A1 | 11/2009 | Chou |
| 2009/0284927 | A1 | 11/2009 | Li et al. |

FOREIGN PATENT DOCUMENTS

| | | |
|---|---|---|
| JP | 09-116056 A | 5/1997 |
| JP | 2002-026201 A | 1/2002 |
| TW | 319406 | 11/1997 |

OTHER PUBLICATIONS

Chu et al., "Energy Efficient Apparatus and Method for Cooling and Electronics Rack", U.S. Appl. No. 12/108,020, filed Apr. 23, 2008.

Campbell et al., "Suspended Integrated Manifold System with Serviceability for Large Planar Arrays of Electronic Modules", IBM Technical Disclosure, IP.com, IP.com No. IPCOM000126455D (Jul. 18, 2005).

Campbell et al., "Liquid Cooling Apparatus and Method of Facilitating Cooling of an Electronic System", U.S. Appl. No. 12/168,259, filed Jul. 7, 2008.

Ellsworth, Jr., et al., "System and Method for Facilitating Cooling of a Liquid-Cooled Electronics Rack", U.S. Appl. No. 11/942,207, filed Nov. 19, 2007.

Campbell et al., "Hybrid Air and Liquid Coolant Conditioning Unit for Facilitating Cooling of One or More Electronics Racks of a Dada Center", U.S. Appl. No. 11/944,680, filed Nov. 26, 2007.

Campbell et al., "Method and Apparatus for Defect Detection in a Cold Plate", U.S. Appl. No. 12/053,762, filed Mar. 24, 2008.

Campbell et al., "Cooling Apparatus and Method of Fabrication Thereof with Jet Impingement Structure Integrally Formed on Thermally Conductive Pin Fins", U.S. Appl. No. 12/141,290, filed Jun. 18, 2008.

Campbell et al., "Cooling Apparatus and Method of Fabrication Thereof with a Cold Plate Formed In Situ on a Surface to be Cooled", U.S. Appl. No. 12/143,289, filed Jun. 20, 2008.

Campbell et al., "Apparatus and Method for Facilitating Pumped Immersion-Cooling of an Electronic Subsystem", U.S. Appl. No. 12/256,628, filed Oct. 23, 2008.

Chee, B., "Supermicro Water Cooled Blades", Info World, Geeks in Paradise, (Mar. 5, 2008), http://weblog.infoworld.com/geeks/archives/2008/03.

Office Action for U.S. Appl. No. 12/491,287, dated Aug. 19, 2010.
Office Action for U.S. Appl. No. 12/491,281, dated Oct. 7, 2010.
Office Action for U.S. Appl. No. 12/491,287, dated Nov. 30, 2010.

* cited by examiner

DIRECT JET IMPINGEMENT-ASSISTED THERMOSYPHON COOLING APPARATUS AND METHOD

BACKGROUND

The present invention relates in general to heat transfer mechanisms, and more particularly, to cooling apparatuses and methods for removing heat generated by one or more electronic devices. Still more particularly, the present invention relates to fluidic cooling apparatuses and methods for cooling one or more electronic devices.

The industry trend has been to continuously increase the number of electronic devices within computing system environments. Compactness allows for selective fabrication of smaller and lighter devices that are more attractive to the consumer. Compactness also allows circuits to operate at higher frequencies and at higher speeds due to the shorter electrical connection distances in these devices. Despite these advantages, providing many electronic devices in a small footprint can create device performance challenges. One of these challenges is thermal management of the overall environment. Heat dissipation issues, if unresolved, can result in electronic and mechanical failures that will affect system performance, irrespective of the size of the environment.

In many computing environments, microprocessors continue to increase in performance, with the active circuitry of the microprocessor chip being driven to an ever smaller footprint, leading to ever higher heat loads and high heat fluxes. Notwithstanding this, reliability constraints often dictate that operating temperature of the devices not exceed a known maximum value.

The existing art has struggled with designing high-performance cooling solutions that can efficiently remove this heat. Conventional cooling solutions depend on conduction cooling through one or more thermal interfaces to an air-cooled heat sink, possibly employing a spreader or vapor chamber. To increase the heat removal capability of air-cooled systems, greater airflow is typically needed. Unfortunately, providing greater airflow is not always possible. Many factors must be taken into consideration in providing ever greater airflow, among which are acoustic noise considerations, as well as power concerns.

As an alternative, liquid cooling methods have recently been incorporated into certain designs. Liquid-cooled microprocessors in the existing art typically incorporate a cold plate design. Cold plate cooled modules, however, are limited by the presence of intermediate materials and interfaces, which restrict heat transfer capabilities of the module.

BRIEF SUMMARY

Briefly summarized, provided herein in one aspect is a cooling apparatus which comprises a cooling subassembly, a pump and a controller. The cooling subassembly includes a jet impingement structure, for directing coolant into a chamber of the subassembly onto a surface to be cooled when in a jet impingement mode, and a thermosyphon associated with the chamber, for facilitating convective cooling of the surface to be cooled via coolant within the chamber when in a thermosyphon mode. The pump actively pumps coolant via the jet impingement structure towards the surface to be cooled when the cooling subassembly is in the jet impingement mode. The controller is coupled to the pump for controlling activation and deactivation of the pump, and also transitioning between the jet impingement mode and the thermosyphon mode. The cooling apparatus provides greater cooling in the jet impingement mode than in the thermosyphon mode, and the controller controls transitioning between the jet impingement mode and the thermosyphon mode depending on cooling requirements for the surface to be cooled.

In another aspect, a cooling apparatus is provided for cooling a plurality of surfaces to be cooled, each surface to be cooled being, or being coupled to, a surface of a respective electronic device of a plurality of electronic devices to be cooled. The cooling apparatus includes a plurality of cooling subassemblies, a pump and a controller. Each cooling subassembly facilitates cooling of a respective surface to be cooled, and includes a jet impingement structure for directing coolant into a chamber of the cooling subassembly towards the respective surface to be cooled when in a jet impingement mode, and a thermosyphon associated with the chamber for facilitating convective cooling of the respective surface to be cooled via coolant within the chamber when in a thermosyphon mode. The pump actively pumps coolant via the jet impingement structures of the plurality of cooling subassemblies towards the respective surfaces to be cooled of the plurality of surfaces to be cooled when in the jet impingement mode. The controller controls activation and deactivation of the pump, and transitioning of the cooling subassemblies between the jet impingement mode and the thermosyphon mode, wherein greater cooling is provided in the jet impingement mode than in the thermosyphon mode.

In a further aspect, a method of cooling a surface to be cooled is provided. The surface to be cooled comprises, or is coupled to, a surface of an electronic device. The method includes: obtaining a cooling subassembly for the surface to be cooled, the cooling subassembly including a jet impingement structure for directing coolant into a chamber of the cooling subassembly onto the surface to be cooled when in a jet impingement mode, and a thermosyphon associated with a chamber of the cooling subassembly for facilitating passive convective cooling of the surface to be cooled via coolant within the chamber when in a thermosyphon mode; utilizing a pump to actively pump coolant via the jet impingement structure towards the surface to be cooled when in the jet impingement mode only; and monitoring a temperature of the electronic device and controlling transitioning of the cooling subassembly between the jet impingement mode and the thermosyphon mode, depending on the temperature of the electronic device.

Further, additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

As used herein, "electronic device" comprises any heat-generating electronic device of a computer system or other electronic system requiring cooling. In one example, the electronic device is or includes an integrated circuit chip, a semiconductor chip and/or any other electronic device requiring cooling. The term "cooled electronic module" includes any electronic module with direct or indirect cooling of an electronic device, with cooled single-chip modules and cooled multi-chip modules being examples of cooled electronic modules, as described herein. In one embodiment, the cooled electronic module disclosed herein employs (in one mode) direct coolant impingement on the surface to be cooled, and is referred to herein as a "direct impingement cooling module". The "surface to be cooled" refers to a surface of the electronic device itself, or to an exposed surface of a thermal cap, thermal spreader, passivation layer, or other structure in contact with the electronic device, and through which heat generated by the electronic device is to be extracted.

As noted, provided herein are enhanced cooling apparatuses and methods which allow (in one mode) for high heat transfer rates from one surface of an electronic device to be cooled using (in a jet impingement mode) a direct or indirect liquid coolant impingement approach. In one embodiment, the cooling liquid comprises a two-phase dielectric coolant. The two-phase dielectric coolant may comprise, for example, a fluorocarbon or a segregated hydrofluoroether liquid (each of which is available from 3M Corporation, St. Paul, Minn., USA). Fluorocarbon liquids typically boil at 30° C.-80° C., at atmospheric pressure. Those skilled in the art should note, however, that the concepts disclosed herein may be utilized with other types of two-phase coolant. For example, the two-phase coolant may be a refrigerant, such as a hydrofluorocarbon refrigerant (e.g., HFC-R410a). Still further, the concepts disclosed herein may be adapted to use with other types of two-phase coolants, such as water, a brine, a liquid metal, or similar coolant, while still maintaining various advantages and unique features of the present invention.

As noted above, performance of computers continues to increase in both speed and function. Heat dissipated by electronic devices, and in particular, processor chips, is increasing correspondingly. Processor chips with an average heat flux of more than 100 W/cm$^2$ and a "hotspot" heat flux approaching 300 W/cm$^2$ are already being considered, and within the next few years, these heat flux levels could approach 200 and 450 W/cm$^2$, respectively. The chip heat loads under consideration already exceed the capability of even the most effective air-cooling apparatuses. Projected chip heat loads are likely even to exceed the capability of water-cooling approaches with a cold plate attached at either the module or chip level.

Figure 1:
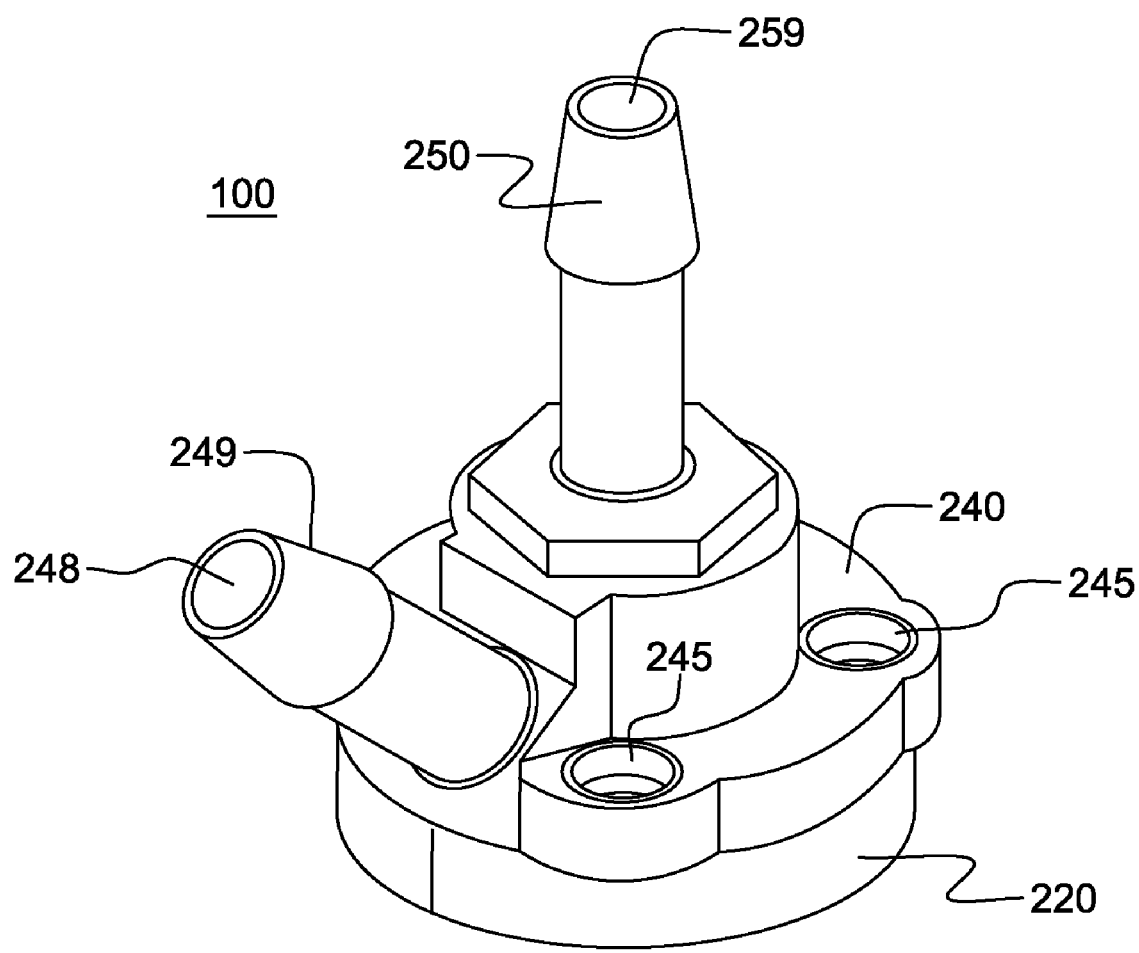
FIG. 1 is an isometric illustration of one embodiment of a direct impingement cooling module to be utilized in accordance with an aspect of the present invention.

One cooling solution which meets junction temperature requirements at these levels of heat flux is coolant in direct contact with the back surface of the electronic device to be cooled. FIG. 1 depicts one embodiment of a cooled electronic module 100 employing direct jet impingement of coolant onto a surface to be cooled (and being alternatively referred to herein as a direct impingement cooling module). The high heat transfer coefficients obtainable in a direct impingement approach make this an especially attractive cooling option for high heat flux electronic packages.

One reason for this is that impinging liquid jets directly onto electronic devices is an effective means of providing high heat transfer rates. When a liquid jet strikes a surface, thin hydrodynamic and thermal boundary layers are formed in the region located directly beneath the jet. Thereafter, the flow is forced to accelerate in a direction parallel to the cooled surface, referred to herein as the surface to be cooled. This accelerated flow is directed in which is termed the wall jet or parallel flow zone.

The thickness of the hydrodynamic and thermal boundary layers in the stagnation region may be on the order of micrometers. Because of this, very high heat transfer coefficients exist in the stagnation zone directly under the jet. Heat transfer coefficients characteristic of parallel flow prevail in the wall jet region. These high heat transfer coefficients make liquid jet impingement an attractive cooling option for thermal control of high-heat-dissipation electronic components.

In addition to the isometric view of FIG. 1, the components of cooled electronic module 100 are shown in exploded view in FIG. 2, with cooled electronic module 100 being described hereinbelow with collective reference to both FIGS. 1 & 2.

Figure 2:
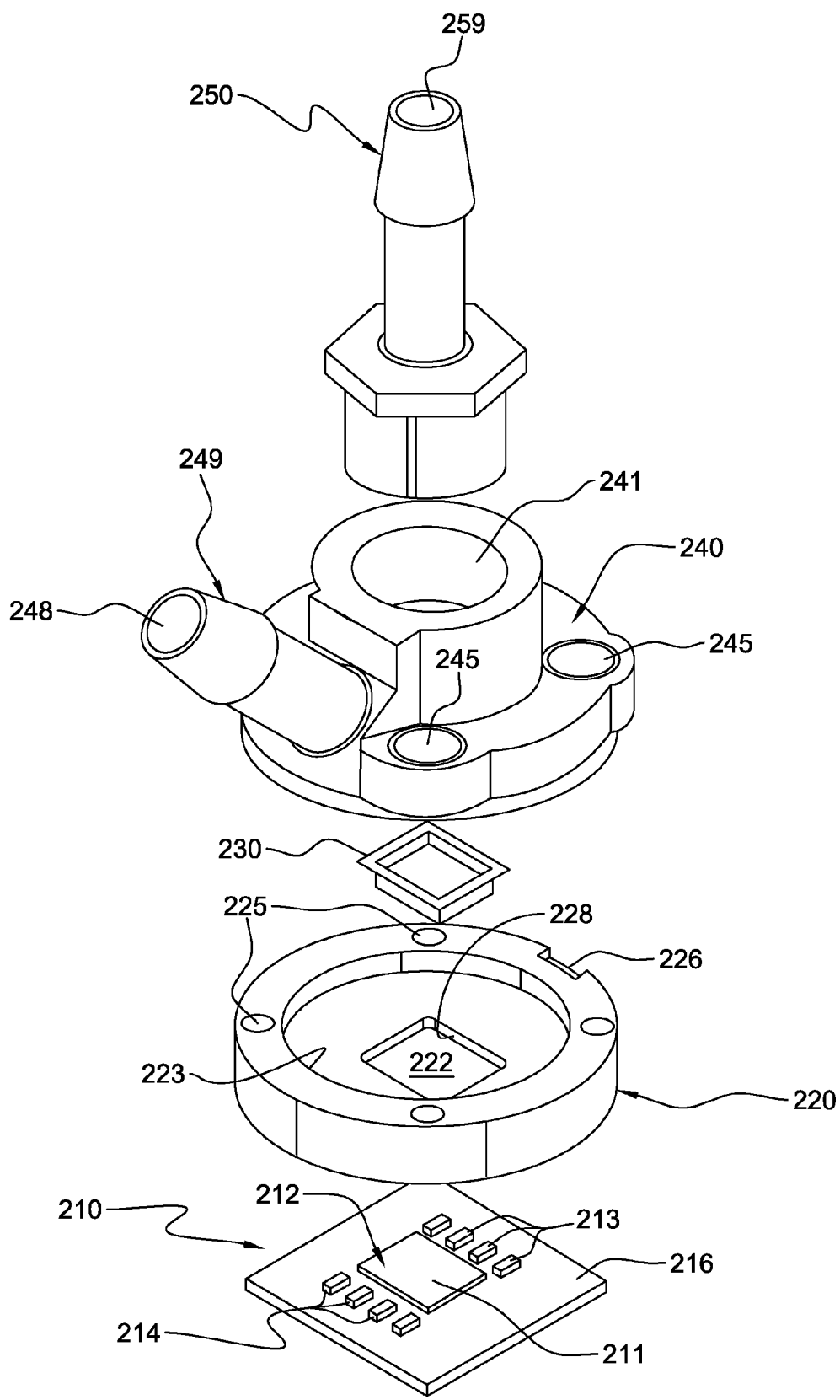
FIG. 2 is an exploded view of the cooling module of FIG. 1 to be utilized in accordance with an aspect of the present invention.

The cooled electronic module 100 includes a to-be-cooled electronics package 210 (FIG. 2). Electronics package 210, in one embodiment, includes a single-chip module (SCM) package 212 and one or more discrete devices 214, such as one or more capacitors, resistors and/or memory devices or other discrete electronics devices. Integrated circuit chip 212 is one example of an electronics device to be cooled.

As shown in FIG. 2, both integrated circuit chip 212 and discrete device(s) 214 are secured to a component carrier 216. Integrated circuit chip 212 can have a high heat flux level, generating a large amount of heat from a small surface area. For example, integrated circuit chip 212 might have a heat flux level exceeding 250 W/cm$^2$.

Integrated circuit chip 212 and discrete devices 214 have back surfaces 211 and 213, respectively, and upper surfaces (not visible in the viewed depiction). The upper surfaces of the integrated circuit chip and the discrete device(s) 214 can be secured to the component carrier's 216 surface or other such similar surface by a variety of ways known to those skilled in the art. In the example of FIG. 2, integrated circuit chip 212 and discrete devices 214 are secured to component carrier 216 by one or more solder connections (not illustrated), with the integrated circuit chip 212 and discrete device(s) 214 in electrical communication. Solder connections between component carrier 216 and integrated circuit chip 212 and discrete device(s) 214 can also be encapsulated, for example, with epoxy, to reduce stress on solder connections due to thermal expansion mismatch between integrated circuit chip 212 and component carrier 216.

In the embodiment of FIG. 2, integrated circuit chip 212 has a generally polygonal shape defined by a plurality of sides which join back surface 211 to the upper surface (not illustrated). In the illustrated embodiment, integrated circuit chip 212 is shown to have a rectangular shape, but other shapes (including non-polygons) can be used if desired.

A frame 220 is also provided as depicted in FIG. 2. Frame 220 (in the depicted embodiment) has an annular shape to enable ready incorporation into cooled electronics module 100 and easy attachment to other components used in cooled electronics module 100. Frame 220 has a thickness illustrated and referenced by numeral 223, and in the embodiment shown, provides adequate surface area for a vertical annular (o-ring) seal (not shown), which fastens and seals a manifold 240 to frame 220. It should also be noted, that the annular shape of the seal/frame is not a requirement and is only provided for process flexibility and facility of assembly with commonly available components. The frame shape, therefore, can be selectively altered to suit other needs.

Frame 220 also comprises (in one embodiment) a centrally-located opening 222. A matching seal member 310 (see FIG. 3A) is provided and formed around integrated circuit chip 212 to prevent leakage of coolant to other adjacent areas. In one embodiment, the matching seal member is annular in shape and disposed to prevent coolant from reaching the controlled-collapse chip connections (C4s) or other surfaces, such as substrate top surface metallurgy. In such a case, however, the frame is connected to component carrier 216 so that the annular area is defined between opening 222 and the one or more electronic components (212/214) to be cooled.

It should be noted that the placement and shape of opening 222 can be altered; for example, based on the shape of frame 220, or other factors such as the placement of the electronic component to be cooled. Regardless of shape and position of opening 222, the enumerated matching sealing member is used to ensure jet impingement on the surface(s) to be cooled of the electronic component. In one embodiment, the sealing member and frame in conjunction with one another are designed to prevent coolant from contacting capacitors 214, as well as I/O connectors securing the chip and other devices to component carrier 216.

As noted, opening 222 is sized and aligned to receive integrated circuit chip 212 for facilitating direct liquid impingement cooling once the module is assembled, as shown in FIG. 1. In one embodiment, opening 222 if formed to create a secure fit over integrated circuit chip 212 once the sealing member is in place. The shape of opening 222 can be identical to that of integrated circuit chip 212, with the perimeter of opening 222 being slightly larger than that of integrated circuit chip 212 (with sides 228 of the orifice being slightly longer than integrated circuit chip 212 sides). In such a case, once the frame is placed over integrated circuit chip 212, the jet impingement is focused and directed towards surface 211 of integrated circuit chip 212.

In alternate embodiments, it is possible to form a larger opening, with appropriate sealing members to include a different topology or a larger area of component carrier 216, if desired. It is even possible to have opening 222 and appropriate sealing members accommodate the entire component carrier 216.

Alternatively, it is possible to have a plurality of orifices, only one of which is illustrated in FIG. 2, as discussed. In an embodiment where frame 220 houses multiple orifices, each orifice can be sized and shaped differently if desired; for example, to fit over one integrated circuit chip, or to securely fit over adjacent electronic components as well. In this case, more than one sealing member may be used and fitted within the plurality of orifices, in order to prevent coolant leakage to unwanted areas.

Frame 220 can be secured to manifold 240 or other elements in the computing environment in a variety of ways known to those skilled in the art. It should be noted that in certain embodiments, frame 220 is attached to the substrate 216 to establish the (annular) seal. The subassembly can then be secured to manifold 240. Thereafter, the inlet fitting to the manifold can be shaped. For example, a single pipe can be molded to act both as the inlet and outlet fitting. Furthermore, in the example provided in FIG. 2, a plurality of attachment components 225 and 226 are employed. The attachment components are fabricated to align with counterpart alignment components in manifold 240 or other such surfaces. In the example depicted, alignment components 225 are a series of circular openings or holes, through which a screw or pin is driven to ensure proper attachment and securing of the frame to other components. Alternatively, the fastening means can be replaced by mechanical means, such as a clamp, in order to hold the parts more securely together. Alignment component 226 is different in shape, having an elongated surface, and can be securely fit into an alignment counterpart to attach frame 220 securely to manifold 240. Use of epoxy or other securing means can also be used to further ensure proper attachment of frame 220 to manifold 240 or other such components in the computing environment.

Manifold 240 includes a jet impingement structure comprising a jet orifice plate 230. Jet orifice plate 230 is provided to control impingement of fluid onto the back surface of the die. Consequently, jet orifice plate 230 is aligned with opening 222 once assembled. In one embodiment, jet orifice plate 230 is molded into manifold 240, even though shown separately in FIG. 2 for ease of understanding.

Manifold 240 comprises an opening 241 which is complementarily shaped with inlet fitting 250. Once manifold 240 is disposed over frame 220, manifold opening 241 and frame orifice 220 are aligned. As discussed above, jet orifice plate 230 is also housed in manifold 240 so that once manifold 240 is disposed over frame 220, jet orifice plate 230 is aligned directly over frame opening 222.

Manifold opening 241 also comprises an inlet manifold (or plenum) for providing coolant for direct liquid impingement on integrated circuit chip 212. The spray area comprises two portions. A first portion accommodates inlet fitting 250 into manifold 240. The coolant will be provided through a manifold inlet 259 in inlet fitting 250. Liquid coolant then traverses the inlet manifold opening and passes through orifice plate 230 onto the surface to be cooled of integrated circuit chip 212.

Manifold 240 also comprises an outlet fitting 249 (with a manifold outlet 248) that can be molded during the same process step as the manifold itself. Outlet fitting 249 can be integral to manifold 240 or it can be a separate entity that is secured to manifold 240 through attachments, as will be appreciated by those skilled in the art. In one embodiment, the manifold can be formed from plastic and molded to a desired shape.

As discussed above, attachment components referenced as 245 are provided on manifold 240, and are aligned with the ones provided on the frame (discussed above as reference number 225) to ensure proper attachment and securing of manifold 240 to frame 220. A variety of techniques known to those skilled in the art can be used to accommodate the attachment. For example, a combination of screws and pins used in conjunction with epoxy could used in one embodiment.

In addition, and as noted above, manifold 240 is fluidly sealed to the frame by another sealing member (not viewable in FIG. 1 or 2). For example, this other sealing member might be an o-ring seal provided on the vertical surface of the frame 220.

As illustrated, manifold 240 is shaped to receive inlet fitting 250 (for receiving fluid coolant flow) and outlet fitting 249 (for removing dissipated heat in all forms (such as vapor) from the electronic component (212) after jet impingement). The inlet and outlet fittings 250 and 249 are also ultimately attached to complementary components, such as coolant supply unit (for example) to enable the flow of coolant into the module and the removal of coolant effluent. Approximately placed sealing members can be used in conjunction with the inlet fitting 250 (or alternatively outlet fitting 249) to prevent fluid leaking to unwanted areas of the computing environment.

Further details of a direct impingement cooled electronics module are provided in U.S. Patent Publication No. 2008/0002363 A1, entitled "Direct Liquid Jet Impingement Module for High Heat Flux Electronics Packages".

Figure 3:
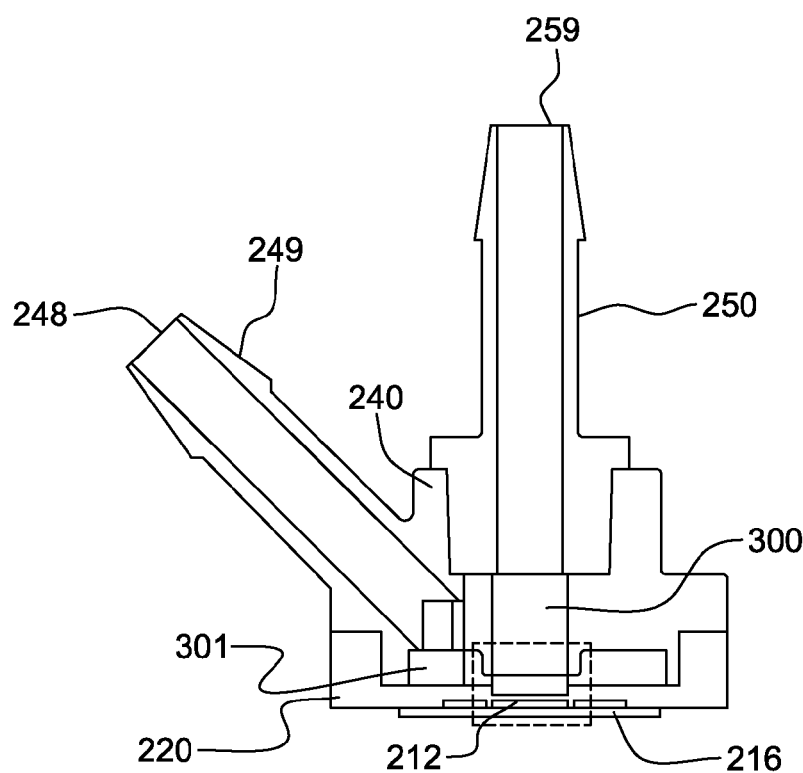
FIG. 3 is a cross-sectional elevational view of the cooling module of FIGS. 1 & 2 to be utilized in accordance with an aspect of the present invention.
Figure 3A:
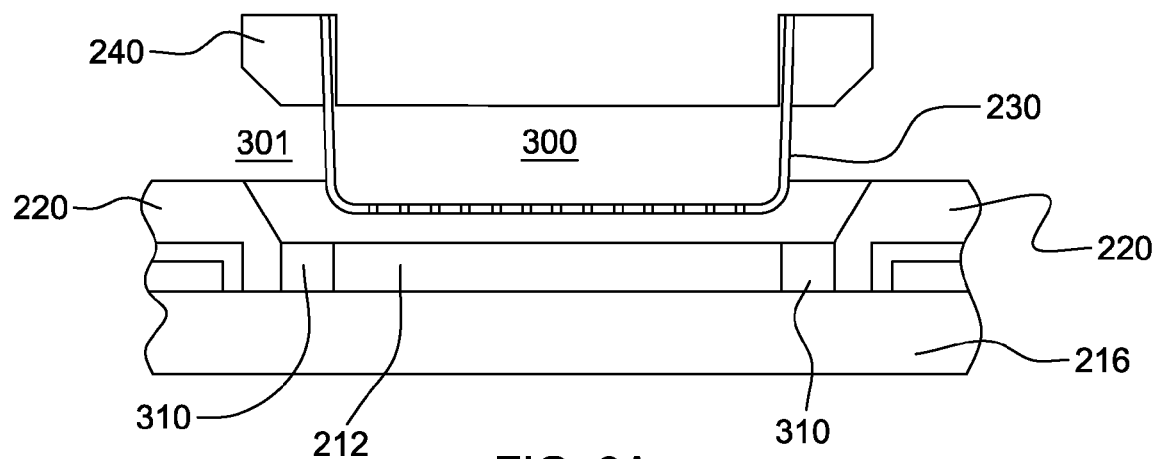
FIG. 3A is a partial enlarged illustration of FIG. 3 showing the jet orifice plate aligned over the surface to be cooled for direct coolant impingement on the surface to be cooled, in accordance with an aspect of the present invention.

FIGS. 3 & 3A depict cross-sectional elevational views of the cooled electronic module described above in connection with FIGS. 1 & 2. As noted, the cooled electronics module includes frame 220, such as a ceramic frame, having an opening sized to receive at least one electronic device, such as an integrated circuit chip 212. As shown in FIG. 3A, frame 220 is secured to substrate 216, which supports integrated circuit chip 212, and a fluid-tight seal 310, such as an annular seal, is provide around the periphery of the integrated circuit chip. Coolant is fed through a manifold inlet 259 to an inlet manifold opening 300 in fluid communication therewith provided in manifold 240. Inlet manifold opening 300 is aligned over the surface to be cooled, such as the exposed back surface 211 (see FIG. 2) of integrated circuit chip 212. Manifold 240 further includes an outlet manifold opening 301 in fluid communication with a manifold outlet 248 of outlet fitting 249 for removing coolant effluent after direct impingement on the surface to be cooled. Jet orifice plate 230 is associated with manifold 240 and is aligned over inlet manifold opening 300. In the embodiment shown, jet orifice plate 230 has a flat jet orifice plate configuration at is base.

The above-described cooled electronic module solution to heat removal is very effective. However, as the total power consumed by electronic devices continues to increase within data processing facilities, it is becoming necessary to seek enhancements in energy efficiency in all aspects of information technology (IT). By way of example, transaction-based computing, such as web hosting, involves time-varying loads on the IT equipment, both in terms of processor utilization and electrical power consumption, which is eventually dissipated as heat. Since the processors in such an application have different states of power consumption, it is advantageous to apply a cooling solution which takes advantage of the lower cooling energy consumption requirements while a processor is in a lower power state. Currently, this type of energy saving approach is applied as a variable fan speed for air-cooled components. However, as high-performance microprocessors dissipate more heat than can be dissipated using air-cooling and a traditional heat sink, this solution becomes unworkable.

Generally stated, disclosed in FIGS. 4-9 are various direct jet impingement-assisted thermosyphon cooling apparatuses and cooling methods. In one embodiment, the cooling apparatus includes a cooling subassembly which comprises a thermosyphon associated with a chamber within which pool boiling of coolant occurs in thermosyphon mode as a result of heat transfer from the surface to be cooled. The thermosyphon is fluidically coupled to an air- or liquid-cooled condenser. When the electronic device to be cooled (such as a microprocessor) is in a low power state, the cooling apparatus performs in this thermosyphon mode, with only natural buoyancy driven flow, and with the heat transfer mechanism at the electronic device being pool boiling. In a higher power state, the electronic device temperature rises, triggering a pump to force flow into the evaporator chamber through an orifice plate of a jet impingement structure of the cooling subassembly, generating an array of submerged jets to impinge on the surface to be cooled. This mode of cooling is referred to herein as the jet impingement mode. Advantageously, such a cooling solution achieves very high heat fluxes; for example, greater than 250 W/cm$^2$ can be achieved using jet impingement, yet the apparatus allows for lower power state cooling when no pumping power is necessary.

Figure 4:
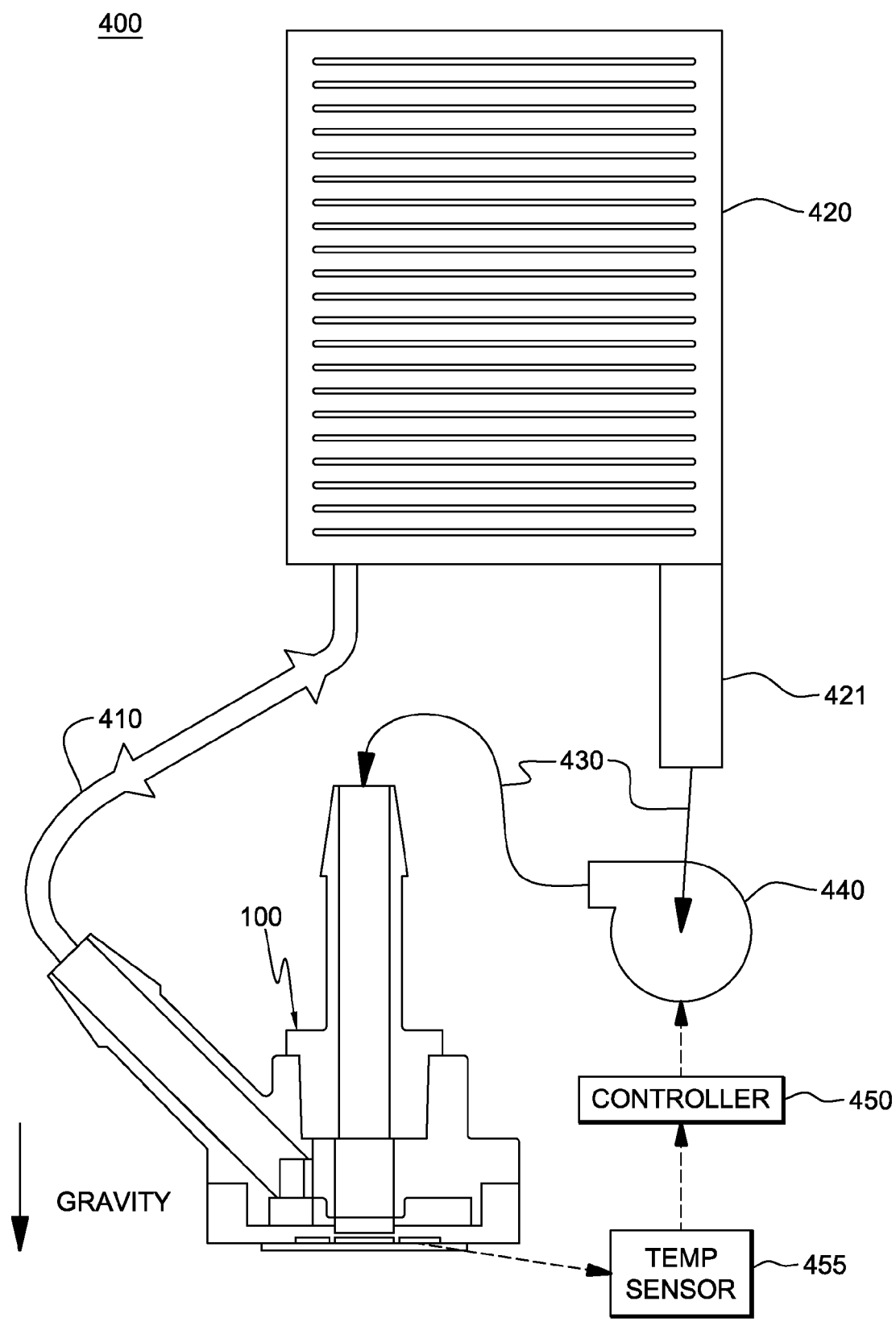
FIG. 4 depicts one embodiment of a cooling apparatus employing the direct impingement cooling module of FIGS. 1-3A, in accordance with an aspect of the present invention.

FIG. 4 schematically illustrates one embodiment of a cooling apparatus 400 employing as the cooling subassembly a single cooled electronic module 100, such as described above in connection with FIGS. 1-3A. As illustrated, cooling apparatus 400 includes a thermosyphon tube 410 which couples the manifold outlet of the cooled electronic module to a condenser (or heat exchanger) 420. Thermosyphon tube 410 is a large diameter tube which functions as a thermosyphon coupling tube connecting in fluid communication the inner chamber of cooled electronic module 100 and condenser 420. Condenser 420 may comprise an air-to-liquid heat exchanger or a liquid-to-liquid heat exchanger. A stand pipe 421 at the outlet of condenser 420 supplies fluid via a condensate tube 430 and pump 440 to the manifold inlet of cooled electronic module 100 when in a jet impingement mode of the cooling apparatus. A temperature sensor 455 is associated with the electronic device to be cooled and is employed by controller 450 in determining whether to activate or deactivate pump 440, and thus, whether to operate the cooling apparatus in the thermosyphon mode or the jet impingement mode, depending on the temperature of the electronic device.

Figure 4A:
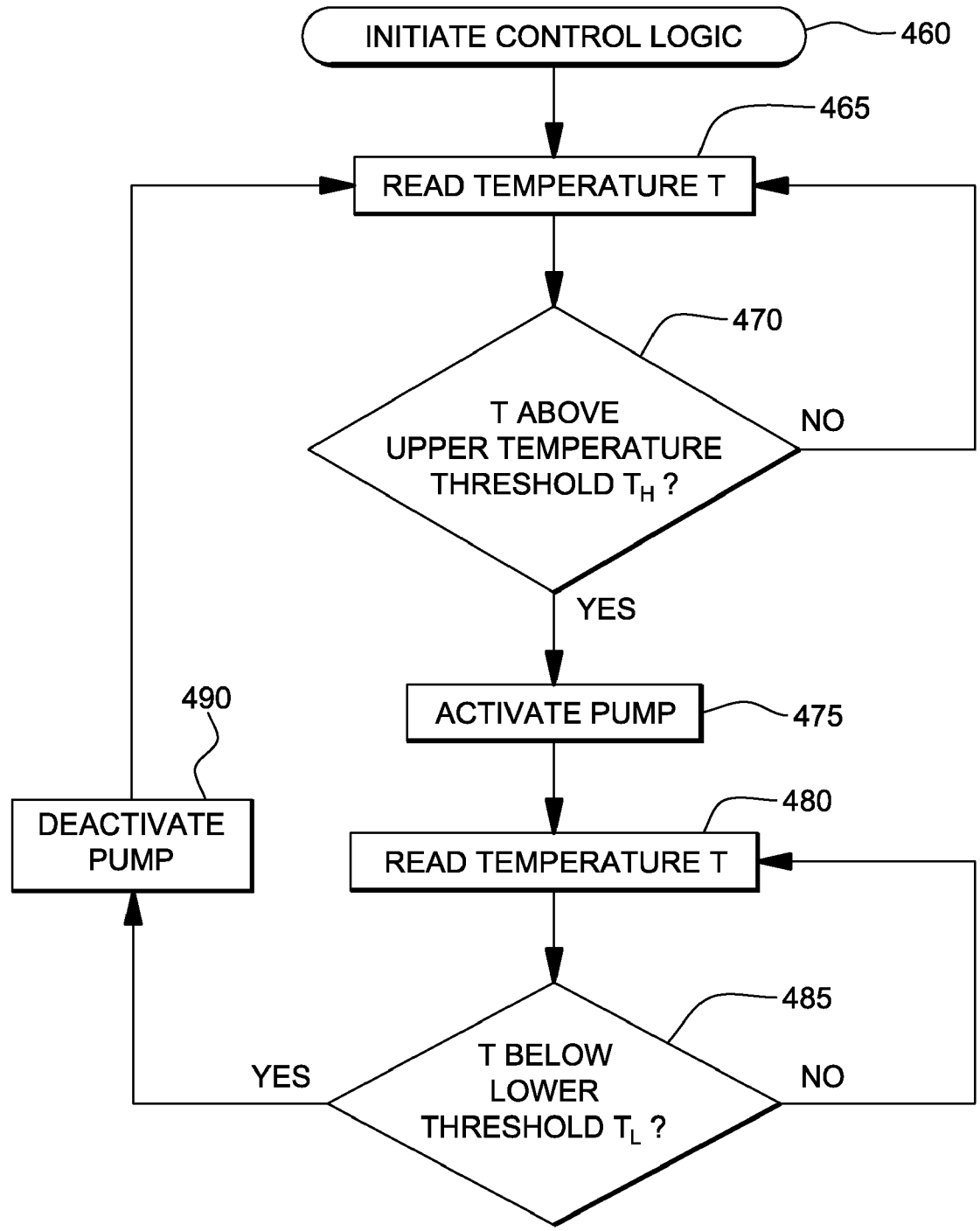
FIG. 4A is a flowchart of one embodiment of control logic implemented by the controller of the cooling apparatus of FIG. 4, in accordance with an aspect of the present invention.

FIG. 4A depicts one embodiment of logic implemented by controller 450 of the cooling apparatus of FIG. 4. This logic implementation employs an upper temperature threshold $T_H$ and a lower temperature threshold $T_L$, which are predetermined to correspond with a high utilization state and a lower utilization state, respectively, of the electronic device. Upon initiating the control logic 460, a temperature of the electronic device is read 465. The control logic determines whether this read temperature is above the upper temperature threshold $T_H$ 470, and if "no", then cycles back to obtain a next temperature reading 465. Depending upon the implementation, an appropriate time delay (not shown) may be added prior to the next temperature reading. While the temperature remains below the upper temperature threshold $T_H$, the cooling apparatus remains in the thermosyphon mode. This mode advantageously reduces (or eliminates) power consumption by the pump during operation of the electronic device in low-utilization state. During low-utilization state of the electronic device, significantly less electricity is required, and therefore, less heat is dissipated, than in a full-utilization mode. A temperature associated with the electronic device is employed as representative of the thermal load of the device. Many electronic devices (e.g., microprocessors) today have integral thermal sensors within the device which can be employed for this purpose. Alternatively, a temperature sensor could be attached to a surface of the electronic device or embedded within a supporting substrate of the electronic device, such as a printed circuit board, with the temperature thresholds being calibrated based on the particular temperature sensing employed. Note that the concepts presented herein are independent of the temperature sensing approach employed.

When electronic device demand increases, and heat dissipation overwhelms the thermosyphon mode's ability to cool the device, a temperature reading above the upper threshold temperature $T_H$ will result, to which the controller responds by activating the pump 475. Activation of the pump (in the single module embodiment of FIG. 4) transitions the cooling apparatus to the jet impingement mode. As explained above in connection with FIGS. 1-3A, the surface to be cooled, for example, the back surface of a microprocessor, is sealed within a cavity (or chamber) within the cooled electronic module. Within that chamber, and separated a small distance parallel to the surface to be cooled, is the orifice plate comprising small openings through which coolant is passed. In this regard, reference U.S. Pat. Nos. 7,375,962; 7,362,574; and 7,079,393. Activating the pump forces liquid coolant through the orifice plate onto the surface to be cooled. Also, as explained above, the resulting array of submerged jets cools significantly more effectively, although there is the added energy cost of running the pump. In the jet impingement mode, the thermosyphon tube functions as a fluid return line, and in both modes, the condenser or heat exchanger facilitates transfer of heat from the surface to be cooled through the coolant, to a secondary coolant, which can be either ambient air or a liquid coolant (such as water).

Continuing with the logic of FIG. 4A, in the jet impingement mode, the controller periodically reads the electronic device temperature 480 (via the temperature sensor), and determines whether the read temperature is below the lower temperature threshold $T_L$ 485. If "no", then the cooling apparatus remains in the jet impingement mode. Once the temperature drops below the lower temperature threshold $T_L$, then the pump is deactivated 490. A device temperature below the lower temperature threshold $T_L$ means that the device is in a low utilization state, and the pump may be disengaged. With no mechanical fluid driver in the system, the coolant (such as a refrigerant or sub-atmospheric water or alcohol, or a mixture thereof, or a dielectric fluid) pools in the chamber on the surface to be cooled and as the electronic device continues to dissipate heat, the coolant begins to boil. Due to the lower density of the generated vapor, buoyancy forces will naturally create a flow of vapor against gravity to the condenser via the thermosyphon tube. Within the condenser, the vapor cools and condenses, falling back along the inner wall of the thermosyphon tube to the chamber of the cooling subassembly. The result is that the electronic device is cooled in the thermosyphon mode in an energy-efficient manner when underutilized, yet when fully utilized, the electronic device is cooled in the jet impingement mode taking advantage of the very high-performance cooling solution of jet impingement.

Figure 5B:
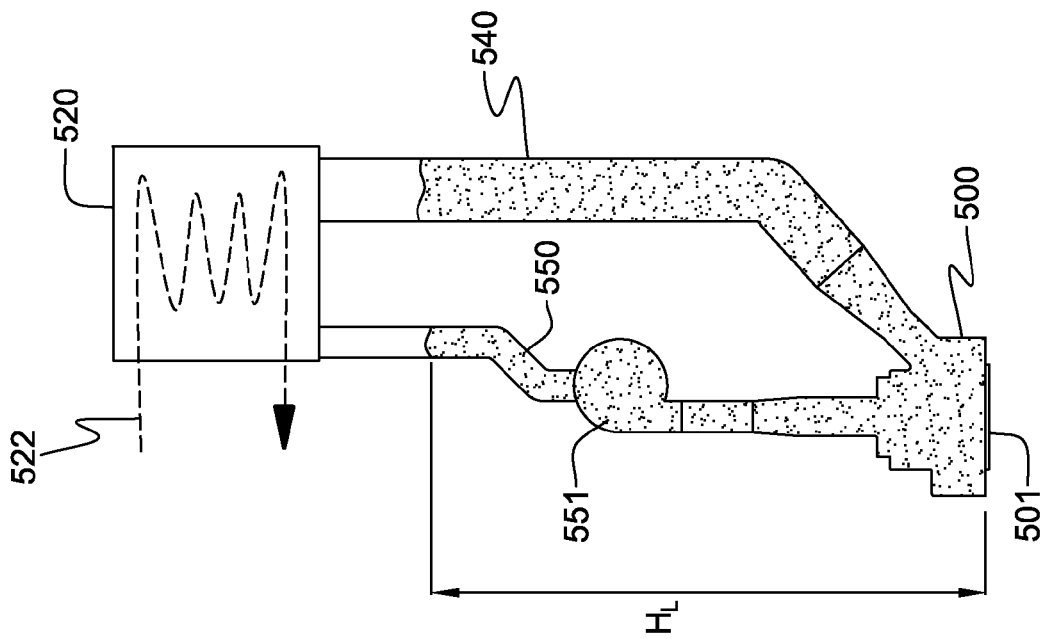
FIG. 5B is a partial schematic of the cooling apparatus of FIG. 4, illustrating a submerged thermosyphon, in accordance with an aspect of the present invention.
Figure 5A:
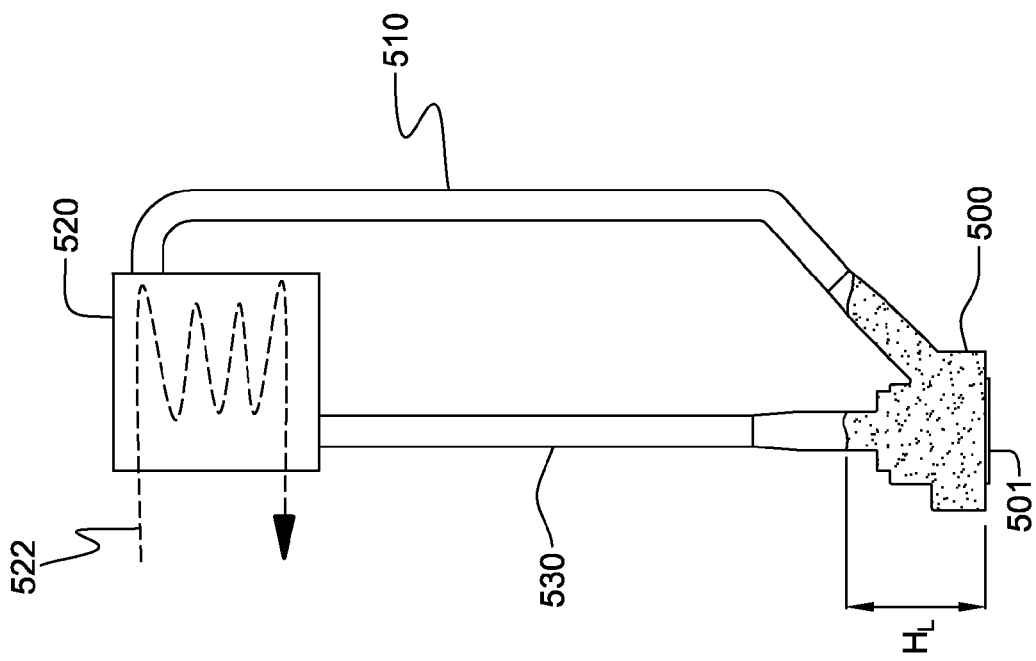
FIG. 5A is a schematic of one embodiment of a thermosyphon for convective cooling of an electronic device, in accordance with an aspect of the present invention.

FIGS. 5A & 5B schematically depict a classical thermosyphon and a submerged thermosyphon, such as may be employed in a cooling apparatus as described herein. In the thermosyphon implementation of FIG. 5A, a boiling chamber 500 coupled to the electronic device 501 to be cooled is at a lower portion of the arrangement, with a vapor tube 510 coupling boiling chamber 500 in communication with a condenser 520, and a condensate tube 530 returning condensate from condenser 520 back to boiling chamber 500. A secondary coolant 522, such as ambient air or facility water, facilitates condensation of vaporized coolant within condenser 520 for return via condensate tube 530 to boiling chamber 500. In this implementation, the liquid head is at a level $H_L$ which is relatively low, and does not extend significantly into either vapor tube 510 or condensate tube 530.

By comparison, the submerged thermosyphon of FIG. 5B includes a boiling chamber 500, such as the coolant chamber described above in connection with the cooled electronic module of FIGS. 1-3A. The boiling chamber 500 is shown coupled to the electronic device 501 to be cooled, and is in fluid communication via a thermosyphon tube 540 with condenser 520, which condenses vaporized coolant via secondary coolant 522 passing through or across condenser 520. A condensate tube 550 couples condenser 520 in fluid communication with boiling chamber 500 for return of coolant to the chamber when in an actively pumped mode (e.g., the jet impingement mode described herein). In fluid communication with condensate tube 550 is a pump 551, such as a centrifugal pump.

In the embodiment of FIG. 5B, the diameter of thermosyphon tube 540 is larger than the diameter of condensate tube 550, since in the thermosyphon mode, deactivation of pump 551 means substantially no vapor or condensate passes through the condensate tube. The thermosyphon depicted in FIG. 5B is submerged since the liquid head level $H_L$ is much higher, extending into the thermosyphon tube, as illustrated. In order to accommodate both a thermosyphon mode and a jet impingement mode, the amount of liquid within the closed loop system of the cooling apparatus needs to be greater than in the thermosyphon embodiment of FIG. 5A to ensure that there is a liquid head above pump 551 when activated to transition the cooling apparatus from thermosyphon mode to jet impingement mode. Note that the location of pump 551 in FIG. 5B is illustrated by way of example only. The pump could be disposed at or below the level of the boiling chamber in order to reduce the amount of liquid coolant within the system. Further, the diameter of thermosyphon tube 540 is greater than the diameter of condensate tube 550, since in the thermosyphon mode, only thermosyphon tube 540 is used. The larger diameter thermosyphon tube facilitates buoyancy driven flow via a two-phase transfer of heat from vaporized coolant passing from the boiling chamber through the thermosyphon tube to the condenser, with condensate dropping back from the condenser towards the boiling chamber along the inner wall of the thermosyphon tube. In operation, coolant vapor bubbles through the liquid coolant within the thermosyphon tube when rising to the condenser.

Figure 6:
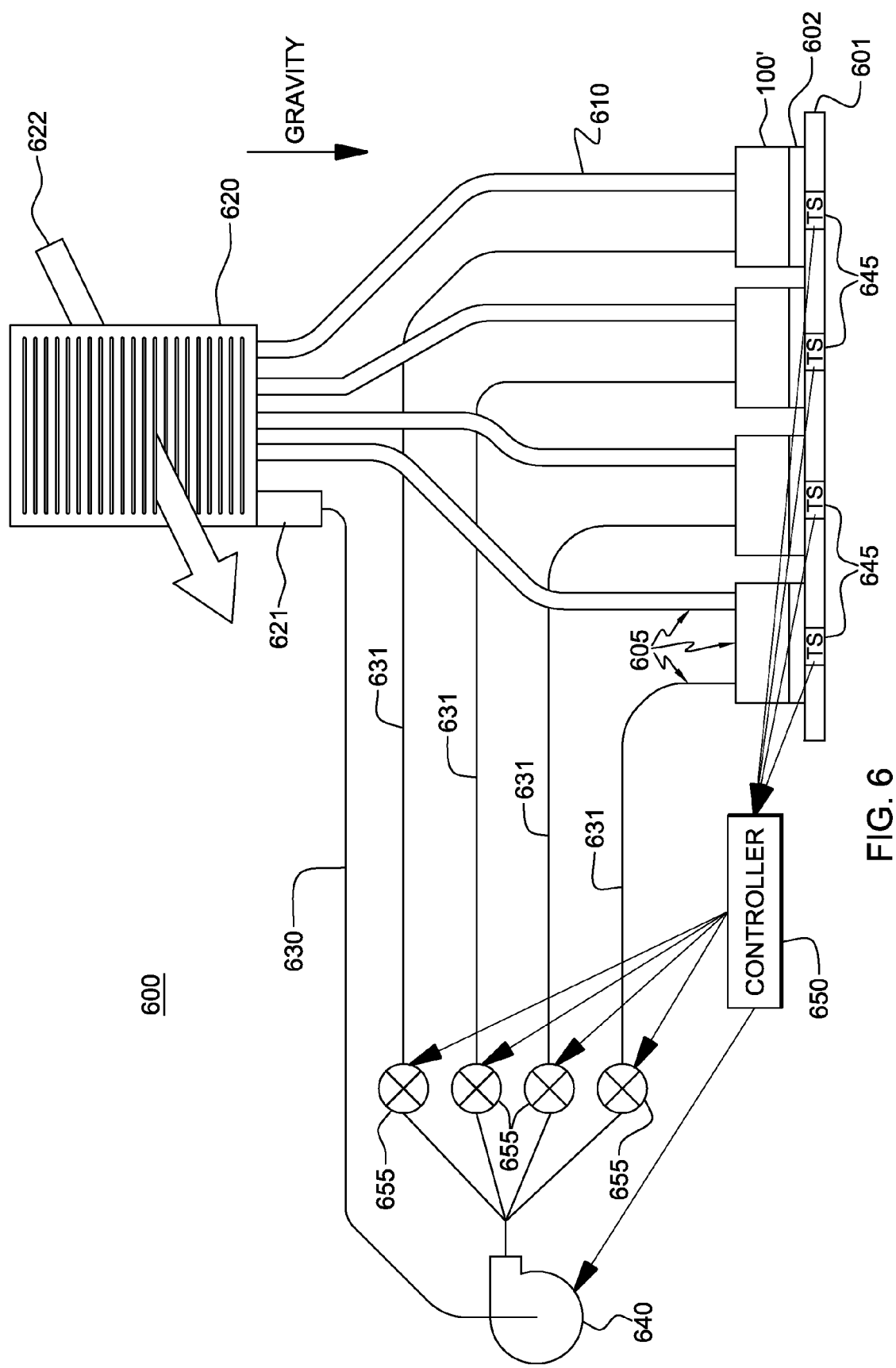
FIG. 6 depicts an alternate embodiment of a cooling apparatus for cooling multiple electronic devices, in accordance with an aspect of the present invention.
Figure 7:
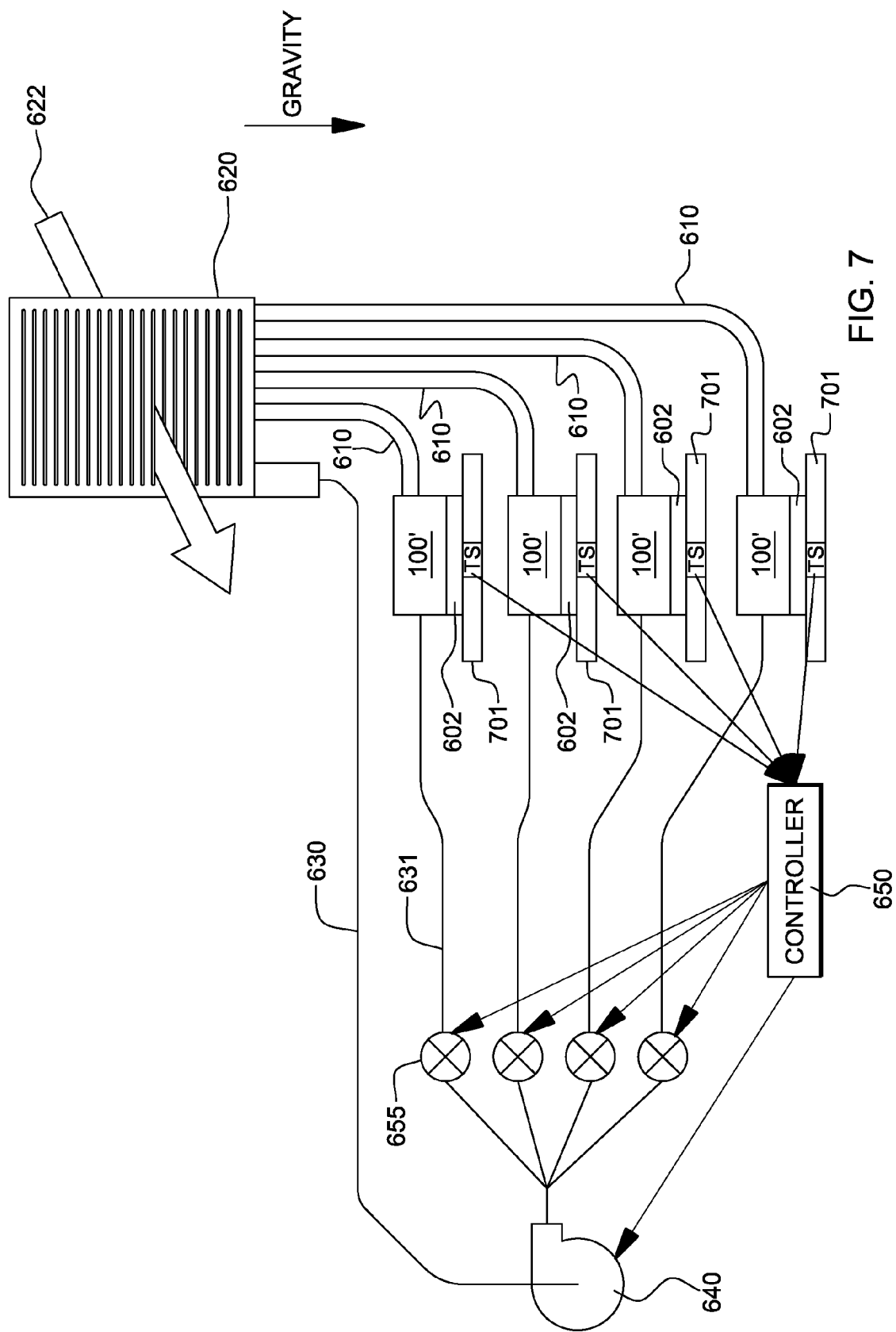
FIG. 7 depicts another embodiment of a cooling apparatus for cooling multiple electronic devices, in accordance with an aspect of the present invention.
Figure 8:
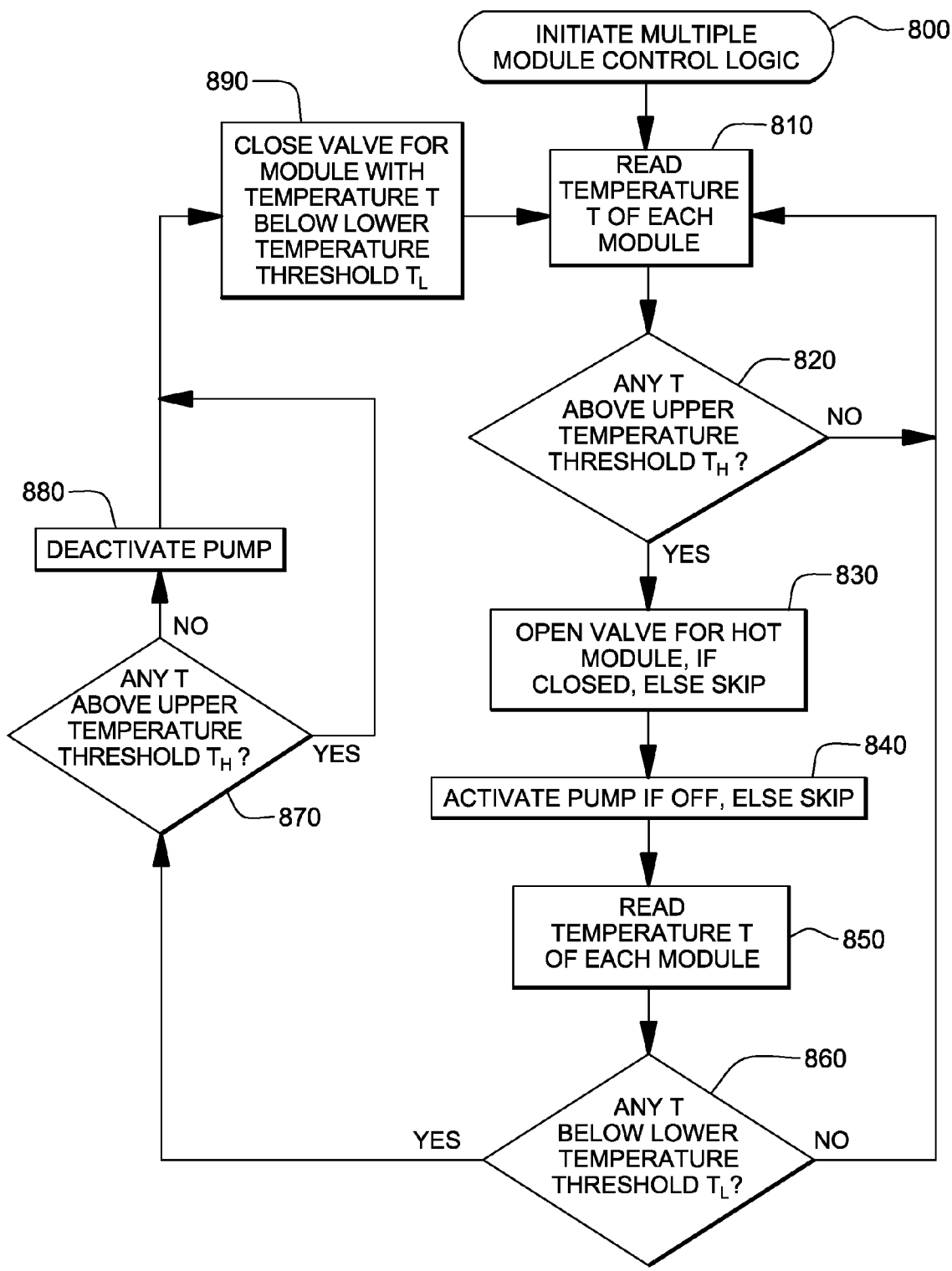
FIG. 8 is a flowchart of one embodiment of control logic implemented by the controller of the cooling apparatus of FIG. 6 or the cooling apparatus of FIG. 7, in accordance with an aspect of the present invention.

FIGS. 6-8 depict one embodiment of a cooling apparatus for cooling multiple electronic devices or modules. In the depicted embodiments, multiple cooling subassemblies are employed for multi-mode cooling of multiple electronic devices. Each cooling subassembly includes, in one embodiment, a direct liquid jet impingement structure such as described above in connection with FIGS. 1-3A, as well as a thermosyphon and a condensate line pump, as described further below.

In FIG. 6, cooling apparatus 600 is employed in cooling multiple electronic modules 602 disposed on a common board 601. Each module 602 has associated therewith a housing 100' (such as described above in connection with FIGS. 1-3A) of a cooling subassembly 605, with the housing and respective module 602 together comprising a cooled electronic module such as described above. As illustrated, each cooling subassembly 605 also includes a respective thermosyphon tube 610 coupling in fluid communication the respective chamber of housing 100' and a heat exchanger 620. The multiple thermosyphon tubes 610 each couple to a common heat exchanger 620 (in this embodiment), which is cooled by a secondary coolant 622, such as air or liquid coolant. A stand pipe 621 provides a liquid head via a condensate line 630 to a pump 640. Pump 640 distributes liquid coolant via individual pump lines 631 back to the cooling chambers of the cooling subassemblies. At least one temperature sensor 645 is associated with each module 602 to be cooled, and the temperature sensors are coupled to a controller 650, which reads the temperature values of the multiple temperature sensors and controls based on those values opening and closing of respective valves 655 associated with the individual pump lines 631. Valves 655 are thus (in one embodiment) temperature-operated valves, such as thermostat or solenoid-controlled valves. In this implementation, one cooling subassembly 605 of the cooling apparatus 600 may be in thermosyphon mode, while another cooling subassembly is in jet impingement mode. For example, the right-most module 602 in FIG. 6 could be operating at a much higher utilization state than the remaining modules, in which case, only the right-most cooling subassembly 605 is operated in the jet impingement mode, with the remaining subassemblies operating in the thermosyphon mode of the cooling apparatus. Valves 655 are opened or closed by controller 650 to accomplish this cooling configuration.

FIG. 7 is substantially identical to FIG. 6, with the exception being that modules 602 are each on separate substrates (or boards) 701 compared with the common substrate (or board) 601 embodiment of FIG. 6.

FIG. 8 depicts one embodiment of control logic implemented within the controller of FIG. 6 or the controller of FIG. 7. Upon initiation of the control logic 800, the controller obtains a temperature T reading for each module 810, and determines whether any temperature T is above a predefined upper temperature threshold $T_H$ 820. If "no", then all modules remain in the passive, thermosyphon mode of the cooling apparatus. Once temperature of one of electronic devices or modules exceeds the upper temperature threshold $T_H$, the controller opens the control valve 655 (FIGS. 6 & 7) for the individual pump line associated with the device or module whose temperature exceeds the upper temperature threshold, that is, assuming that the valve was closed 830, and then activates the pump, assuming that the pump was off 840. The controller then reads the temperature T of each module 850 and determines whether any temperature T reading is below a predefined lower temperature threshold $T_L$ 860. If "no", then the control logic returns to read the temperature T of each module 810, and continues in this loop until a temperature is below the lower temperature threshold $T_L$ 860. If "yes", then the controller determines whether any temperature T reading is above the upper temperature threshold $T_H$ 870, and if "no", then the pump is deactivated 880. After the pump is deactivated, or if one or more temperature T reading(s) is above the upper temperature threshold $T_H$, then the controller closes the valve(s) for the pump line associated with the module(s) having a temperature below the lower temperature threshold $T_L$ 890, before continuing by obtaining a next temperature T reading for each module 810.

Figure 9:
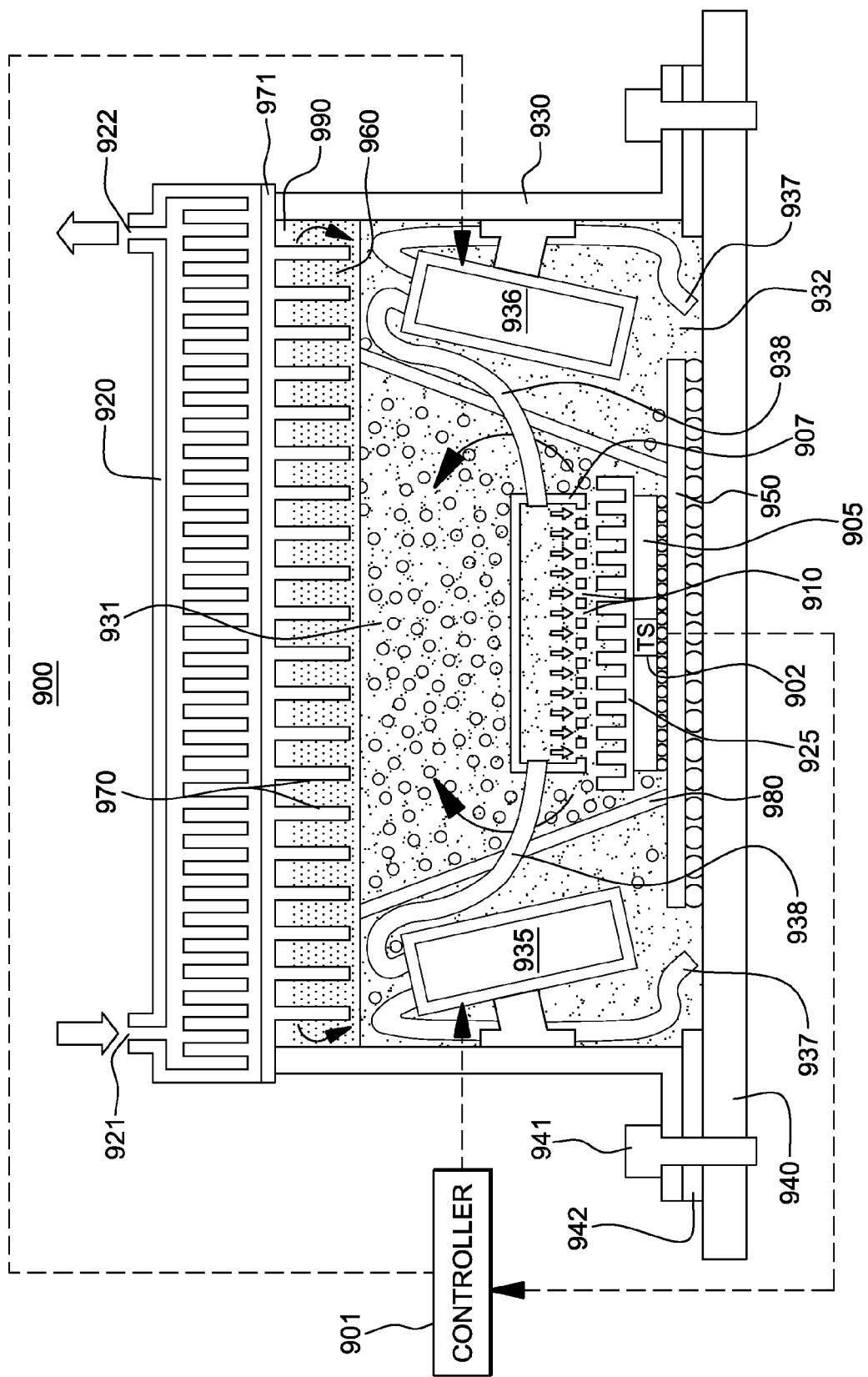
FIG. 9 depicts a further embodiment of a cooling apparatus, in accordance with an aspect of the present invention.

FIG. 9 depicts a further embodiment of a cooling apparatus, in accordance with an aspect of the present invention. This figure depicts one embodiment of a pump-enhanced, immersion cooled electronic module 900, which is a structural and thermal interface between a heat-generating electronic device 905, such as a processor or other integrated circuit die, and a liquid-cooled cold plate 920. Cooled electronic module 900 includes a module casing 930 which forms part of a housing, configured to at least partially surround and form a sealed, fluid-tight compartment 931 about electronic device 905 to be cooled. As shown, dielectric coolant 932 is disposed within sealed compartment 931, as are two impingement-cooling, immersed pumps 935, 936. Each impingement-cooling, immersed pump 935, 936 includes an inlet pump tube 937 disposed within an inlet in a lower portion of the sealed compartment for drawing liquid dielectric fluid for pumping towards the electronic device to be cooled via a manifold structure 907. By way of specific example, the impingement-cooling, immersed pumps may each be an LPD-125 liquid pump offered by AdaptivEnergy, LLC, of Hampton, Va., USA.

Manifold structure 907 is positioned within the sealed compartment over the electronic device to be cooled. Manifold structure 907 functions as a submerged jet impingement plenum and includes jet orifices 910 for jet impingement of dielectric fluid onto a boiling heat sink 925, which is thermally coupled to the electronic device. The pump outlet tubes 938 of the pump subassemblies feed dielectric fluid into manifold structure 907 under pressure. The dielectric fluid is then forced through the plurality of jet orifices 910 as dielectric fluid jets that strike the fluid boiling heat sink structure 925. Alternatively, fluid boiling heat sink structure 925 may be omitted, in which case, the plurality of dielectric fluid jets would strike, for example, the back surface of heat-generating electronic device 905. In either case, the result is a removal of heat via a two-phase convective heat transfer. As the dielectric liquid absorbs heat, it undergoes phase change from the liquid phase to the vapor phase, and thus utilizes its latent heat of vaporization for cooling purposes The housing is a shell-like component that is attached to, for example, a printed circuit board 940 using bolts or screws 941 and a sealing gasket (or o-ring) 942, which is compressed between a lower surface of the housing and an upper surface of the board, or alternatively, between a lower surface of the housing and an upper surface of a substrate 950 to which the electronic device 910 directly couples. As shown, multiple electrical connections, such as controlled-collapse chip connections (C4 connections), electrically couple the electronic device to substrate 950, which in this embodiment is itself electrically coupled via another set of electrical connections to printed circuit board 940.

As used herein, the word "substrate" refers to any underlying supporting structure, such as substrate 950 or printed circuit board 940 to which the electronic device is coupled, and to which the housing may be sealed in order to form sealed compartment 931 about the electronic device. Sealing gasket 942 seals off the inner compartment of the housing and assists in retaining the dielectric fluid within the sealed compartment. The two impingement-cooling, immersed pumps 935, 936 are, in this embodiment, coupled to opposing side walls of the housing, and are positioned, sized and configured to force (when activated) pressurized dielectric coolant towards the heat-generating electronic device to be cooled, such as the back surface of the heat-generating electronic device.

As noted, when in operation, as dielectric fluid absorbs heat, it boils, undergoing phase change from liquid phase to vapor phase, thus utilizing its latent heat of vaporization for cooling purposes. The resultant dielectric fluid vapor rises to the upper portion of the sealed compartment and forms a dielectric vapor layer 960 in the upper portion of the sealed compartment. Vapor rises since it possesses a significantly lower density compared with the surrounding dielectric liquid. A submerged baffle (or vapor barrier) 980 facilitates directing dielectric fluid vapor upwards to the upper portion of the sealed compartment. At the upper most portion of the sealed compartment, there is illustrated a thin, non-condensable gas layer 990 comprising gases, such as air, which have also left the liquid and travel upwards. These gases can reside in solution within the dielectric fluid, but once out-gassed through the boiling process, cannot be returned to solution via a coolant condensation process.

As depicted, cooled electronic module 900 further comprises a plurality of condenser fins 970 extending into the sealed compartment from a top wall 971 of the housing. In one embodiment, these condenser fins are appropriately sized for the anticipated dielectric vapor layer 960 to form in the upper portion of the sealed compartment with operation of the heat-generating electronic device. Upon reaching the upper portion of the sealed compartment, the dielectric fluid vapor contacts the cool surfaces of the condenser fins, which are cooled, for example, by means of a thermal conduction coupling to liquid-cooled cold plate 920, and more particularly, to system coolant passing via inlet 921 and outlet 922 through the liquid-cooled cold plate. By making contact with the cool, vertically-oriented condenser fin surfaces, the dielectric fluid vapor undergoes a second phase change process condensing from vapor to liquid state, and the liquid droplets fall back downward due to gravity and their relatively higher density compared with the neighboring vapor region. By way of example, the vertically-oriented condenser fins might comprise pin fin or plate fin structures.

Dielectric liquid in the lower portion of the sealed compartment is simultaneously being drawn into the low pressure side of the immersed pumps 935, 936 via the inlet pump tubing 937. Note that the submerged baffle 980 is configured to function to partially isolate the vapor rich region near the electronic device from the liquid (condensate) rich region near the pump inlet tube openings. The baffle may include openings in its lower portion to allow the dielectric fluid to find its own common level within the sealed compartment. As long as the boiling and condensation cooling processes are in equilibrium and are commensurate with heat generated by the electronic device to be cooled, the electronic module will successfully transport heat from the electronic device to the cold plate.

The coolant employed within the dielectric module is a dielectric fluid so as not to cause a short circuit of electrical current on the various exposed parts of the electronic device and substrate. Many dielectric fluids are commercially available and may be used in the cooled electronic module configuration described herein. Examples include the Novec fluids, manufactured by 3M Corporation (e.g., FC-72, FC-86, HFE-7000 and HFE-7200). Those skilled in the art should note that in addition to the cooling taking place from the electronic device due to the impinging dielectric fluid, there is also heat transfer occurring from the substrate and any other component within the enclosure which generates heat. It should also be noted that the cooled electronic module embodiment of FIG. 9 employs two immersed pumps for redundancy, in the event of a single pump failure. Other configurations may employ only one pump, or even more than two pumps if desired.

Further details and variations on a pump-enhanced, immersion-cooled electronic module such as depicted in FIG. 9 are disclosed in co-filed U.S. patent application Ser. No. 12/491,281, entitled "Cooled Electronic Module with Pump-Enhanced Dielectric Fluid Immersion Cooling", and co-filed U.S. patent application Ser. No. 12/491,286, entitled "Condenser Fin Structures Facilitating Vapor Condensation Cooling of Coolant", and co-filed U.S. patent application Ser. No. 12/491,287, entitled "Condenser Structures with Fin Cavities Facilitating Vapor Condensation Cooling of Coolant", and co-filed U.S. patent application Ser. No. 12/491.293, entitled "Condenser Block Structures with Cavities Facilitating Vapor Condensation Cooling of Coolant", the entirety of each of which is hereby incorporated herein by reference.

In accordance with an aspect of the present invention, a controller 901 is coupled to the immersed pumps 935, 936, as well as to a temperature sensor 902 associated with the heat-generating electronic device 905 to be cooled. Controller 901 implements (in one embodiment) a control logic such as described above in connection with FIG. 4A to activate or deactivate the submerged pumps, and thus switch between a jet impingement mode and a thermosyphon mode, depending on the cooling requirements of the electronic device, as represented by the temperature of the electronic device when operating. Note that functioning of the thermosyphon mode of the cooling apparatus of FIG. 9 would be as described above in connection with the cooling apparatus of FIG. 4. In the cooling apparatus embodiment of FIG. 9, however, the condenser is incorporated within the housing of the cooling apparatus.

As will be appreciated by one skilled in the art, aspects of the controller described above may be embodied as a system, method or computer program product. Accordingly, aspects of the controller may take the form of an entirely hardware embodiment, an entirely software embodiment (including firmware, resident software, micro-code, etc.) or an embodiment combining software and hardware aspects that may all generally be referred to herein as a "circuit", "module" or "system". Furthermore, aspects of the controller may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus or device.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language or similar programming languages.

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling apparatus comprising:
    a cooling subassembly comprising:
        a jet impingement structure for directing coolant into a chamber of the cooling subassembly onto a surface to be cooled when in a jet impingement mode; and
        a housing, the housing including the jet impingement structure and the chamber;
    a condenser disposed above the housing;
    a first coolant line coupling the chamber of the housing in fluid communication with the condenser and facilitating convective cooling of the surface to be cooled via the coolant within the chamber when in a thermosyphon mode;
    a second coolant line coupling the condenser in fluid communication with the jet impingement structure of the housing;
    a pump in fluid communication with the second coolant line, the pump for actively pumping the coolant via the jet impingement structure of the cooling subassembly towards the surface to be cooled when in the jet impingement mode; and
    a controller coupled to the pump for controlling activation and deactivation of the pump, and transitioning between the jet impingement mode and the thermosyphon mode, wherein the cooling apparatus provides greater cooling in the jet impingement mode than in the thermosyphon mode, and the controller controls transitioning between the jet impingement mode and the thermosyphon mode depending on cooling requirements for the surface to be cooled;
    wherein the first coolant line functions as a thermosyphon tube when the cooling apparatus is in the thermosyphon mode, with the coolant flowing bi-directionally between the chamber and the condenser through the first coolant line, and the first coolant line functions as a coolant return tube when the cooling apparatus is in the jet impingement mode, with the coolant flowing unidirectionally from the chamber towards the condenser via the first coolant line, and the coolant returning from the condenser to the chamber via the second coolant line.

2. The cooling apparatus of claim 1, wherein the surface to be cooled is passively cooled in the thermosyphon mode by pool boiling of the coolant within the chamber.

3. The cooling apparatus of claim 2, wherein the condenser is disposed above the chamber to facilitate convection cooling of the surface to be cooled when in the thermosyphon mode.

4. The cooling apparatus of claim 1, wherein the surface to be cooled is, or is coupled to, a surface of an electronic device, and wherein the controller transitions the cooling apparatus between the jet impingement mode and the thermosyphon mode based on a temperature of the electronic device.

5. The cooling apparatus of claim 4, wherein the controller activates the pump to transition the cooling apparatus to the jet impingement mode when the temperature of the electronic device is above a predefined high temperature threshold $T_H$, and deactivates the pump to transition the cooling apparatus from the jet impingement mode to the thermosyphon mode when the temperature of the electronic device drops below a predefined low temperature threshold $T_L$.

6. The cooling apparatus of claim 4, further comprising a temperature sensor associated with the electronic device, the temperature sensor being coupled to the controller for providing the controller with the temperature of the electronic device.

7. The cooling apparatus of claim 1, wherein the first coolant line is sized with a larger coolant flow diameter than the second coolant line, the larger coolant flow diameter of the first coolant line facilitating convection cooling of the surface to be cooled through circulating of the coolant between the chamber and the condenser during pool boiling of the coolant within the chamber.

8. The cooling apparatus of claim 7, wherein when in the thermosyphon mode, the first coolant line is a submerged thermosyphon tube with liquid coolant residing therein to a level above the pump in fluid communication with the second coolant line.

9. A cooling apparatus for cooling a plurality of surfaces to be cooled, each surface to be cooled comprising, or being coupled to, a surface of a respective electronic device of a plurality of electronic devices to be cooled, the cooling apparatus comprising:
a plurality of cooling subassemblies, each cooling subassembly facilitating cooling of a respective surface of the plurality of surfaces to be cooled, and each cooling subassembly comprising:
a jet impingement structure for directing coolant into a chamber of the cooling subassembly onto the respective surface to be cooled when in a jet impingement mode;
a housing, the housing including the jet impingement structure and the chamber;
a condenser disposed above the housing;
a first coolant line coupling the chamber of the housing in fluid communication with the condenser and facilitating convective cooling of the surface to be cooled via the coolant within the chamber when in a thermosyphon mode;
a second coolant line coupling the condenser in fluid communication with the jet impingement structure of the housing;
a pump in fluid communication with the second coolant line, the pump for actively pumping the coolant via the jet impingement structures of the plurality of cooling subassemblies towards the respective surfaces to be cooled of the plurality of surfaces to be cooled when in the jet impingement mode; and
a controller for controlling activation and deactivation of the pump, and transitioning of the plurality of cooling subassemblies between the jet impingement mode and the thermosyphon mode, wherein greater cooling is provided in the jet impingement mode than in the thermosyphon mode,
wherein the first coolant line functions as a thermosyphon tube when the cooling apparatus is in the thermosyphon mode, with the coolant flowing bi-directionally between the chamber and the condenser through the first coolant line, and the first coolant line functions as a coolant return tube when the cooling apparatus is in the jet impingement mode, with the coolant flowing unidirectionally from the chamber towards the condenser via the first coolant line and the coolant returning from the condenser to the chamber via the second coolant line.

10. The cooling apparatus of claim 9, wherein the controller separately controls transitioning of the each cooling subassembly of the plurality of cooling subassemblies between the jet impingement mode and the thermosyphon mode depending on a temperature of the respective electronic device.

11. The cooling apparatus of claim 9, wherein the each cooling subassembly of the plurality of the cooling subassemblies further comprises a respective valve disposed in fluid communication between the pump and the jet impingement structure thereof, and controlled by the controller for controlling transitioning of the each cooling subassembly between the jet impingement mode and the thermosyphon mode, wherein the controller independently controls the mode of the each cooling subassembly depending on a temperature of the respective electronic device.

12. The cooling apparatus of claim 11, wherein the controller opens the respective valve of the each cooling subassembly of the plurality of cooling subassemblies to transition the each cooling subassembly to the jet impingement mode when temperature of the respective electronic device is above a predefined high temperature threshold $T_H$.

13. The cooling apparatus of claim 12, wherein the controller transitions the each cooling subassembly from the jet impingement mode to the thermosyphon mode when temperature of the respective electronic device drops below a predefined low temperature threshold $T_L$.

14. The cooling apparatus of claim 9, wherein each respective surface to be cooled is passively cooled in the thermosyphon mode by pool boiling of the coolant within the chamber.

15. The cooling apparatus of claim 14, wherein the condenser is disposed above the chamber to facilitate convection cooling of the respective surface to be cooled.

16. A method of cooling a surface to be cooled, the surface to be cooled comprising, or being coupled to, a surface of an electronic device, the method comprising:
obtaining a cooling subassembly for the surface to be cooled, the cooling subassembly comprising:
a jet impingement structure, for directing coolant into a chamber of the cooling subassembly onto the surface to be cooled when in a jet impingement mode,
a housing, the housing including the jet impingement structure and the chamber;
a condenser disposed above the housing;
a first coolant line coupling the chamber of the housing in fluid communication with the condenser and facilitating convective cooling of the surface to be cooled via the coolant within the chamber when in a thermosyphon mode;
a second coolant line coupling the condenser in fluid communication with the jet impingement structure of the housing; and
utilizing a pump to actively pump the coolant via the jet impingement structure towards the surface to be cooled when in the jet impingement mode only;
utilizing the first coolant line as a thermosyphon tube when the cooling apparatus is in the thermosyphon mode, with the coolant flowing bi-directionally between the chamber and the condenser through the first coolant line, and utilizing the first coolant line as a coolant return tube when the cooling apparatus is in the jet impingement mode, with the coolant flowing unidirectionally from the chamber towards the condenser via the first coolant line;
utilizing the second coolant line when the cooling apparatus is in the jet impingement mode, with the coolant returning from the condenser to the chamber via the second coolant line; and
monitoring a temperature of the electronic device and controlling transitioning of the cooling subassembly between the jet impingement mode and the thermosyphon mode depending on the temperature of the electronic device.

17. The method of claim 16, wherein the surface to be cooled is passively cooled in the thermosyphon mode by pool boiling of the coolant within the chamber.

18. The method of claim 17, wherein the condenser is disposed above the chamber to facilitate convection cooling of the surface to be cooled when in the thermosyphon mode.

19. The method of claim 16, wherein the controlling comprises transitioning the cooling subassembly from the thermosyphon mode to the jet impingement mode when the temperature of the electronic device exceeds a predefined high temperature threshold $T_H$, and transitioning the cooling subassembly from the jet impingement mode to the thermosyphon mode when the temperature of the electronic device drops below a predefined low temperature threshold $T_L$.

* * * * *